United States Patent
Strang (10) Patent No.: US 7,740,704 B2
(45) Date of Patent: Jun. 22, 2010

(54) HIGH RATE ATOMIC LAYER DEPOSITION APPARATUS AND METHOD OF USING

(75) Inventor: Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 886 days.

(21) Appl. No.: 10/875,949

(22) Filed: Jun. 25, 2004

(65) Prior Publication Data

US 2005/0284370 A1    Dec. 29, 2005

(51) Int. Cl.
- C23C 16/52 (2006.01)
- C23C 16/455 (2006.01)
- H01L 21/306 (2006.01)
- C23F 1/00 (2006.01)
- C23C 16/06 (2006.01)
- C23C 16/22 (2006.01)

(52) U.S. Cl. ............... 118/715; 118/696; 118/695; 118/698; 118/706; 156/345.24; 156/345.26; 156/345.33

(58) Field of Classification Search ................. 118/715, 118/696, 695, 698, 706; 156/345.24, 345.26, 156/345.33
See application file for complete search history.

(56) References Cited

U.S. PATENT DOCUMENTS

| | | | | |
|---|---|---|---|---|
| 5,105,761 A | * | 4/1992 | Charlet et al. | 118/723 ME |
| 5,312,519 A | * | 5/1994 | Sakai et al. | 134/1.1 |
| 5,368,685 A | * | 11/1994 | Kumihashi et al. | 216/70 |
| 5,500,256 A | * | 3/1996 | Watabe | 427/579 |
| 6,071,572 A | * | 6/2000 | Mosely et al. | 427/570 |
| 6,185,839 B1 | * | 2/2001 | Kholodenko et al. | 34/255 |
| 6,383,954 B1 | * | 5/2002 | Wang et al. | 438/789 |
| 7,323,231 B2 | * | 1/2008 | Derderian | 427/576 |
| 2003/0033979 A1 | * | 2/2003 | Kholodenko et al. | 118/715 |

FOREIGN PATENT DOCUMENTS

| | | |
|---|---|---|
| JP | 03-264672 | 11/1991 |
| JP | 06-314660 | 11/1994 |
| JP | 2000-357687 | 12/2000 |
| JP | 2003-234346 | 8/2003 |
| JP | 2003-347218 | 12/2003 |
| WO | WO 02/71463 A1 | 9/2002 |

OTHER PUBLICATIONS

Standard Technique Collections of the JPO, 1-5-1-4, ALCVD (Atomic Layer CVD).

* cited by examiner

Primary Examiner—Rudy Zervigon
(74) Attorney, Agent, or Firm—Oblon, Spivak, McClelland, Maier & Neustadt, L.L.P.

(57) ABSTRACT

A processing system for performing atomic layer deposition (ALD) including a process chamber, a substrate holder provided within the process chamber, and a gas injection system configured to supply a first process gas and a second process gas to the process chamber. The gas injection system is configured to introduce the first process gas and the second process gas to the processing chamber at a first location and a second location, wherein at least one of the first process gas and the second process gas is alternatingly and sequentially introduced between the first location and the second location.

21 Claims, 7 Drawing Sheets

HIGH RATE ATOMIC LAYER DEPOSITION APPARATUS AND METHOD OF USING

BACKGROUND OF THE INVENTION

1. Field of Invention

The present invention relates to plasma processing and more particularly to a method for improved plasma processing.

2. Description of Related Art

Typically, during materials processing, plasma is employed to facilitate the addition and removal of material films when fabricating composite material structures. For example, in semiconductor processing, a (dry) plasma etch process is utilized to remove or etch material along fine lines or within vias or contacts patterned on a silicon substrate. Alternatively, for example, a vapor deposition process is utilized to deposit material along fine lines or within vias or contacts on a silicon substrate. In the latter, vapor deposition processes include chemical vapor deposition (CVD), and plasma enhanced chemical vapor deposition (PECVD).

In PECVD, plasma is utilized to alter or enhance the film deposition mechanism. For instance, plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD), a form of PECVD or more generally CVD, has emerged as a candidate for ultra-thin gate film formation in front end-of-line (FEOL) operations, as well as ultra-thin barrier layer and seed layer formation for metallization in back end-of-line (BEOL) operations. In ALD, two or more process gasses are introduced alternatingly and sequentially in order to form a material film one monolayer at a time. Such an ALD process has proven to provide improved uniformity in layer thickness and conformality to features on which the layer is deposited. However, the deposition rate for ALD is generally dependent on the rate in which the two or more gases can be sequenced. The present inventors have recognized that current deposition systems are cumbersome in design and do not adequately address the need for rapid sequencing of gasses in an ALD process. Thus, current ALD processes generally have a slow deposition rate that is not feasible for many production requirements, which has been an impedent wide acceptance of ALD films despite their superior characteristics.

SUMMARY OF THE INVENTION

One object of the present invention is to reduce or eliminate any or all of the above-described problems.

Another object of the present invention is to provide a method of depositing a material with improved deposition characteristics.

Yet another object of the invention is to provide a method and apparatus for improving the rate of deposition using atomic layer deposition.

These and/or other objects of the present invention are provided by a method and system for performing atomic layer deposition. According to one aspect of the invention, an atomic layer deposition (ALD) system for depositing a film on a substrate is described. The system includes a processing chamber; a substrate holder coupled to the process chamber and configured to support the substrate; a pumping system coupled to the process chamber and configured to evacuate the process chamber; a plasma source coupled to the process chamber and configured to generate plasma in the process chamber; and a gas injection system coupled to the process chamber and configured to introduce a first process gas and a second process gas to the processing chamber at a first location and a second location, wherein at least one of the first process gas and the second process gas is alternatingly and sequentially introduced between the first location and the second location.

According to another aspect of the invention, a method for depositing a thin film on a substrate using a plasma assisted atomic layer deposition (ALD) process is described comprising: disposing the substrate in a processing chamber configured to facilitate the plasma assisted ALD process; introducing a first process gas at a first location within the processing chamber; introducing a second process gas at the first location; introducing the first process gas at a second location within the processing chamber; and introducing the second process gas at the second location, wherein at least one of the first process gas and the second process gas is alternatingly and sequentially introduced between the first location and the second location.

DETAILED DESCRIPTION OF PREFERRED EMBODIMENTS

In order to improve deposition characteristics particularly in high aspect ratio features, the invention provides a processing system and method of operation that improves feasibility of depositing ALD layers, having more uniform and, conformal deposition characteristics, on an exposed substrate surface.

For instance, in ALD processes, one or more gases can be pulsed with or without the flow of a continuous gas to form thin, conformal films of metal, metal nitride, metal oxide, nitrides, and oxides one monolayer at a time. Consequently, one aspect of material deposition using ALD processes is the rate at which a film is formed on the substrate. The present inventors have recognized that the rate is, in general, related to the rate at which reactants can be sequenced and exchanged within the processing system. Therefore, the greater the sequencing and gaseous exchange rate, the greater the deposition rate.

The invention generally relates to a plasma processing system including a gas injection system capable of providing a first precursor through a first array of gas injection orifices and a second precursor through a second array of gas injection orifices. The gas injection system is further configured to alternate the introduction of the first process gas and the second process gas. Additionally, the gas injection system is further configured to sequence the location of the introduction of the first process gas and the second process gas.

Figure 1:
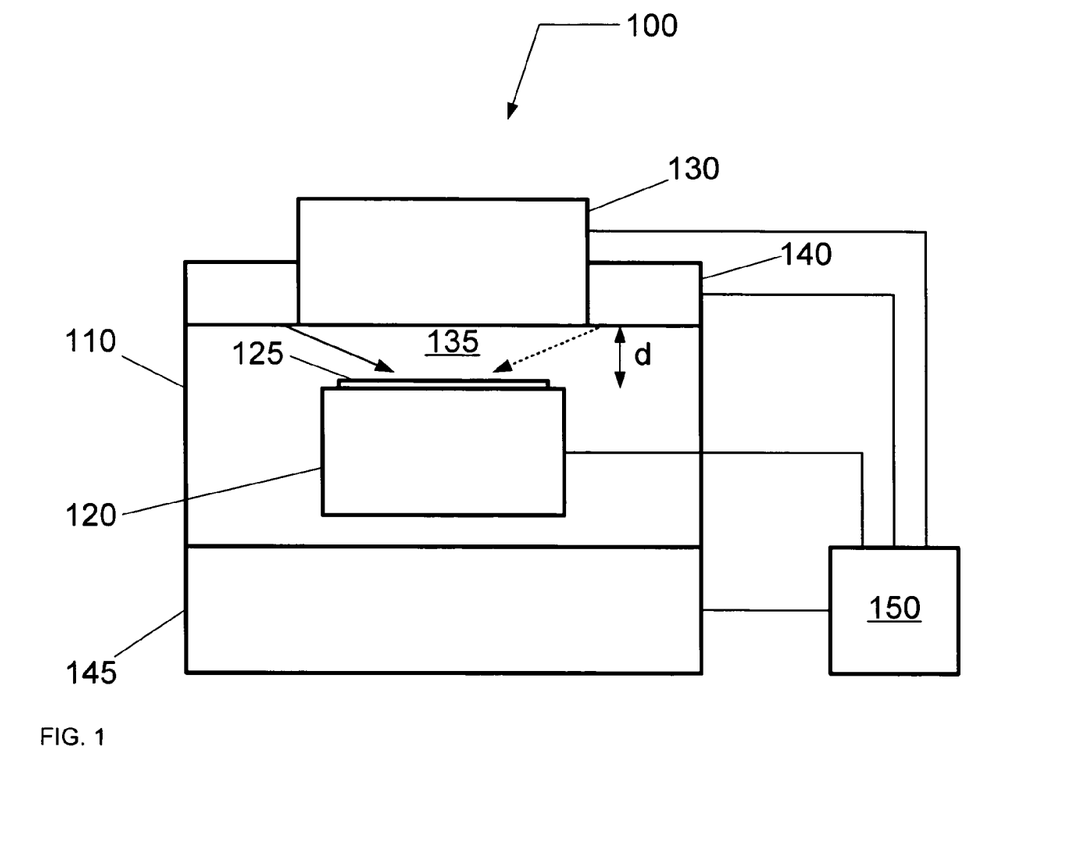
FIG. 1 depicts a schematic view of a plasma processing device according to an embodiment of the invention.

A processing system 100 for performing an ALD process is shown in FIG. 1 including a processing chamber 110 having a substrate holder 120 for supporting a substrate 125. Additionally, processing system 100 includes a plasma source 130 for forming plasma in process space 135, and a gas injection system 140 configured to introduce a first process gas and a second process gas. Furthermore, the gas injection system 140 is configured to sequentially and alternatingly introduce the first and second process gases, as well as sequence the location from which the first and second process gases are introduced into processing chamber 110. A pumping system 145 is coupled to the processing chamber 110, and configured to evacuate the processing chamber 110. A control system 150 is coupled to the pumping system 145, the substrate holder 120, the gas injection system 140 and plasma source 130 to control these components as described herein.

Figure 2:
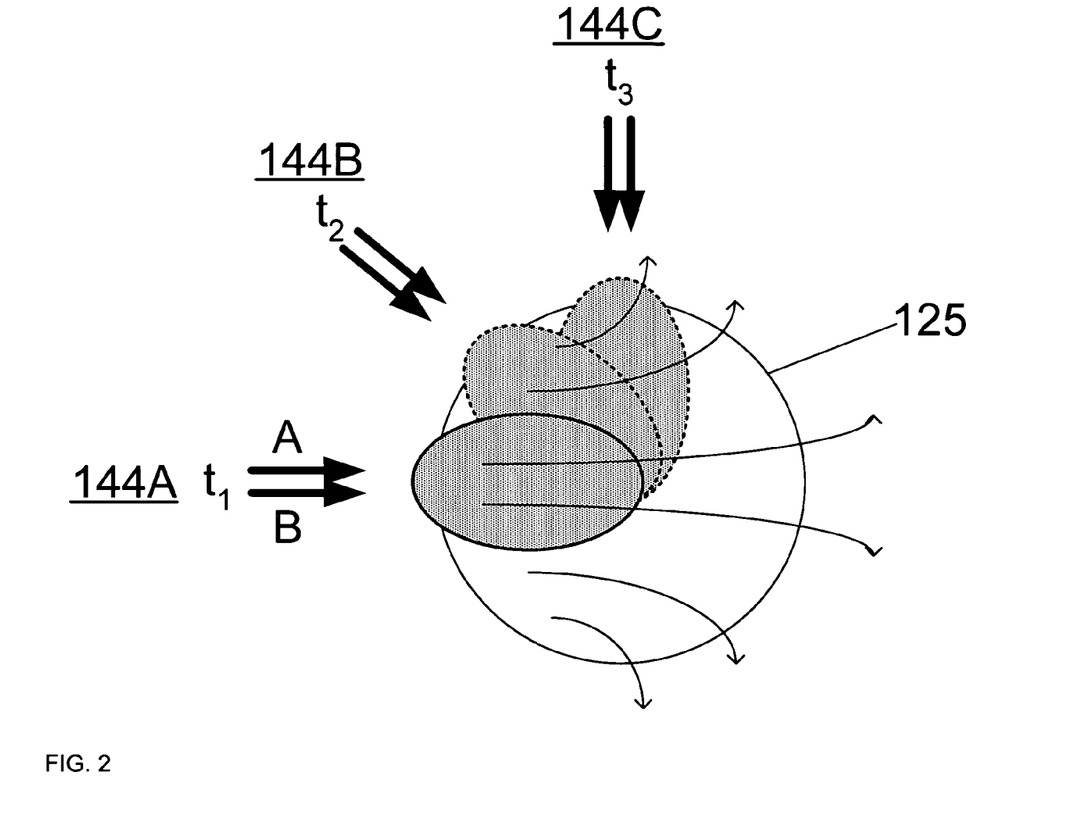
FIG. 2 illustrates a gas injection method according to the embodiment of the invention.
Figure 3:
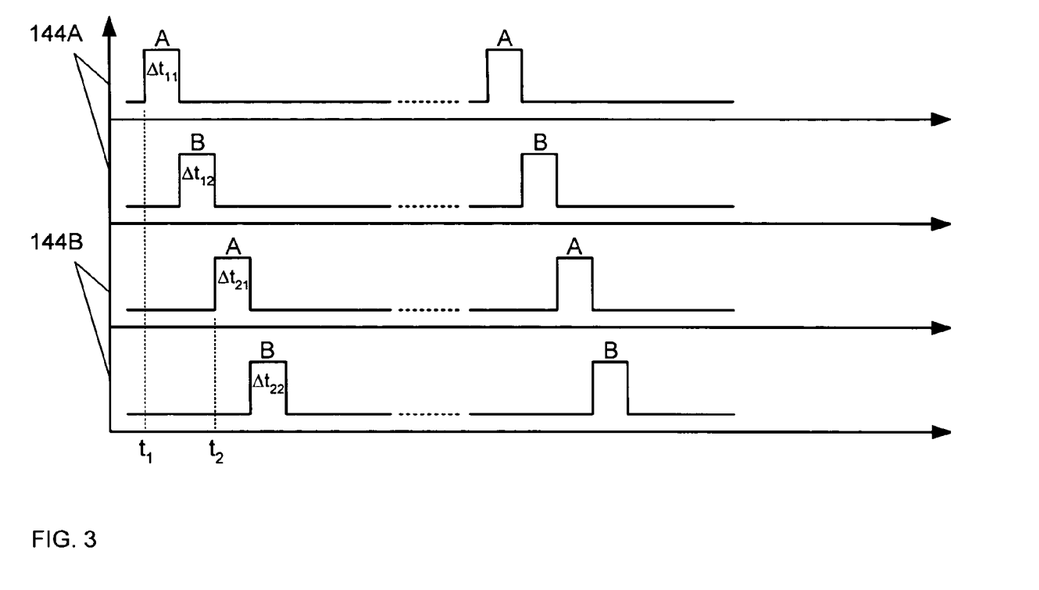
FIG. 3 depicts a timing diagram for a gas injection method according to an embodiment of the invention.
Figure 4:
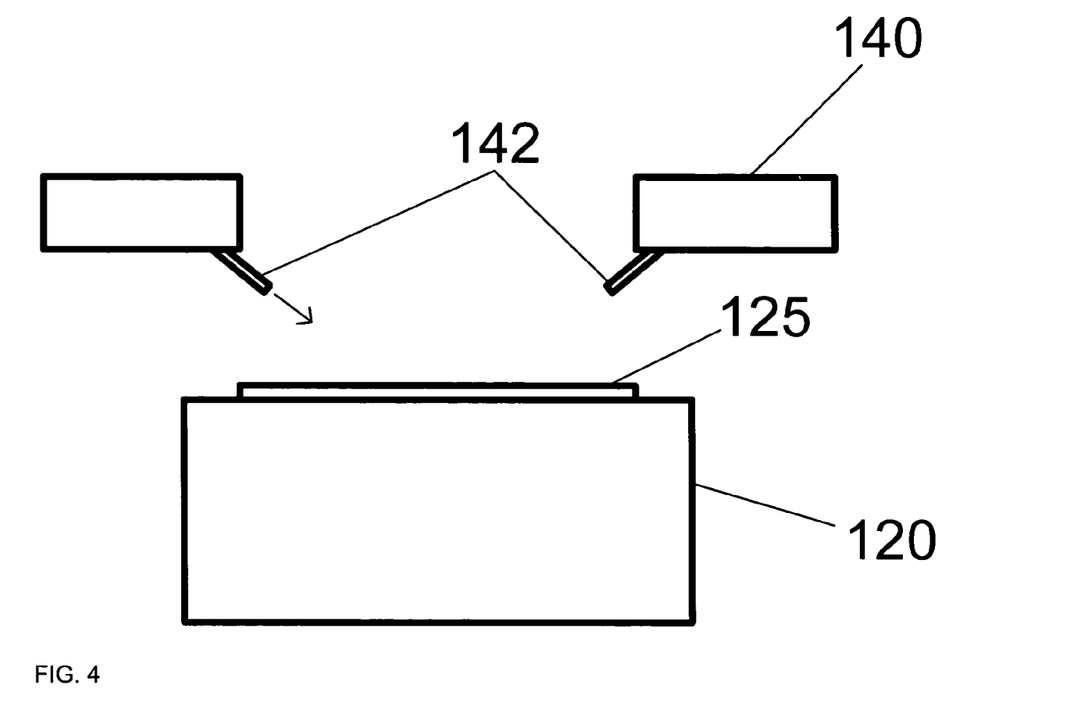
FIG. 4 presents a side view of a gas injection system according to an embodiment of the invention.
Figure 5:
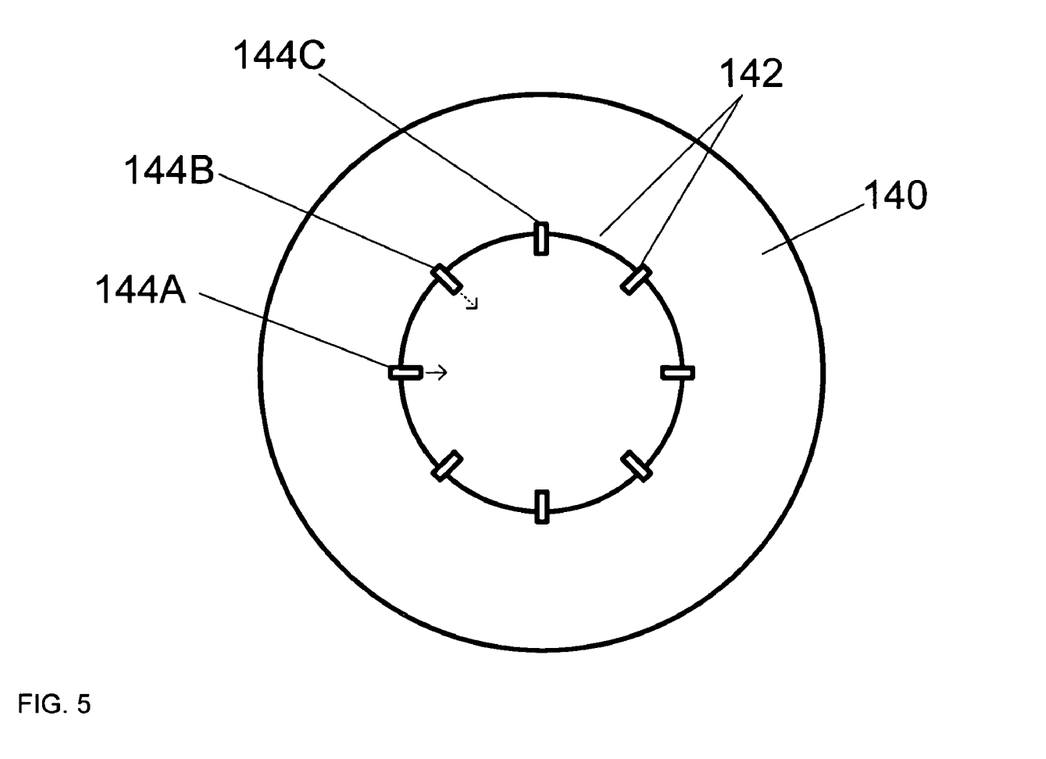
FIG. 5 presents a plan view of the gas injection system depicted in FIG. 3.

Referring now to FIGS. 2, 3, 4, and 5, a method and apparatus for introducing two or more process gases to processing chamber 110 is described. As shown in FIGS. 2, 4, and 5, process gases are introduced above substrate 125 using gas injection system 140. For example, as illustrated in FIGS. 2, 3, and 5, a first process gas (A) is introduced at a first location 144A at time $t_1$ for a duration $\Delta t_{11}$ and a second process gas (B) is introduced at the first location 144A during or following the introduction of the first process gas (A) for a duration $\Delta t_{12}$. Thereafter, the introduction of the first process gas (A) and the second process gas (B) is repeated for a second location 144B for time durations $\Delta t_{21}$ and $\Delta t_{22}$, a third location 144C, and so on. Although the introduction of the second process gas (B) is shown to follow the introduction of the first process gas (A), it should be recognized that the first and second process gases can be introduced at the same time with or without the same time duration, or they may be phased relative to one another. Furthermore, although the sequencing from one location to another is shown to be performed one following the other, it should be recognized that the sequencing can be coincident in time, or overlapping in time, or phased in time. Alternately, either the first process gas or the second process gas can continuously flow.

Figure 6:
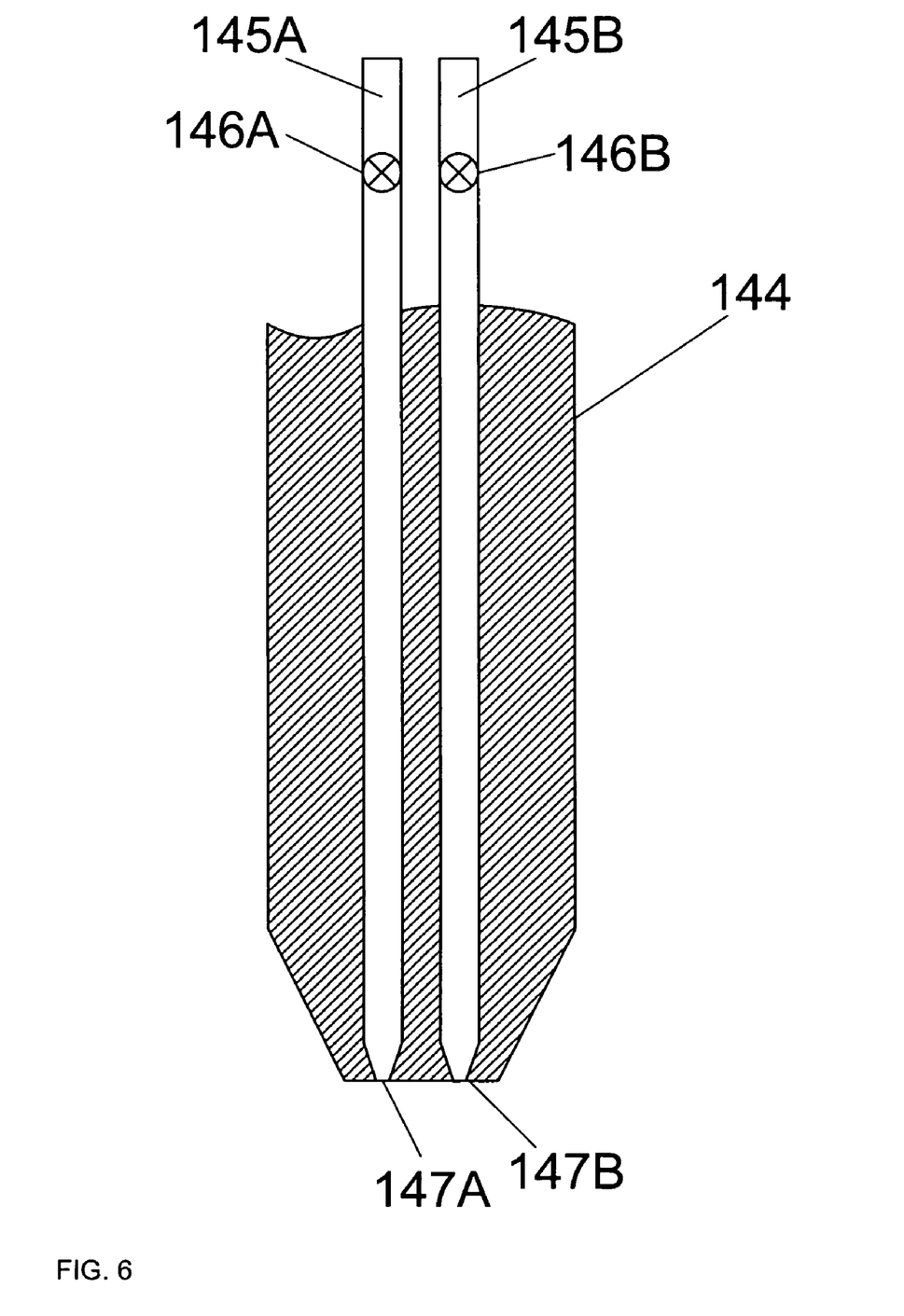
FIG. 6 presents a cross-sectional view of a nozzle assembly according to an embodiment of the invention.

As shown in FIGS. 4 and 5, gas injection system 140 includes a plurality of nozzle assemblies 144 configured to introduce two or more process gases at two or more locations relative to substrate 125. Each nozzle assembly 144 is positioned at a different location, i.e., 144A, 144B, 144C, etc., and is configured to introduce two or more process gases, such as the first process gas (A) and the second process gas (B). As illustrated in FIG. 6, each nozzle assembly 144 includes two or more gas supply lines, e.g., a first gas line 145A for the first process gas and a second gas line 145B for the second process gas. Each gas line 145A and 145B is coupled to a gas supply system (not shown) configured to supply the two or more process gases. Additionally, first gas line 145A and second gas line 145B include a first gas injection valve 146A and a second gas injection valve 146B, respectively, as well as a first injection orifice 147A and a second injection orifice 147B through which the two or more process gases are introduced to processing chamber 110. The first and second gas injection valves 146A, 146B can include pneumatic driven valves, or electro-mechanical (solenoidal) valves. Furthermore, the first and second gas injection valves 146A, 146B can include high-rate pulsed gas injection valves. An exemplary pulsed gas injection system is described in greater detail in pending U.S. application 60/272,452, filed on Mar. 2, 2001, which is incorporated herein by reference in its entirety.

Referring again to FIG. 1, plasma source 130 can include a slotted plane antenna (SPA) plasma source, such as the plasma source described in detail in U.S. Pat. No. 6,675,737B2, published World (WO) Application No. 2002/080248A1, and published WO Application No. 2003/001578A1; the contents of which are incorporated herein in their entirety. Additionally, plasma source 130 can include an electrode coupled to a power source, such as a radio frequency (RF) generator, or a coil antenna coupled to a power source, such as a helical coil coupled to a RF generator. For example, the plasma source 120 can include a capacitively coupled plasma (CCP) source, or an inductively coupled plasma source (ICP), or combination thereof. Alternately, plasma source 120 can include those capable of production of large area plasmas, such as electron beam sources with low electron temperature, as well as those capable of high density flat plasma production based on surface waves, helicon, or electron cyclotron resonance (ECR) plasma sources.

Referring still to FIG. 1, substrate holder 120 can comprise an electrostatic clamping system (or mechanical clamping system) in order to electrically (or mechanically) clamp substrate 125 to the substrate holder 120. Furthermore, substrate holder 120 can, for example, further include a cooling system having a re-circulating coolant flow that receives heat from substrate holder 120 and transfers heat to a heat exchanger system (not shown), or a heating system that transfers heat from the heat exchanger system to the substrate holder 120. Moreover, a heat transfer gas can, for example, be delivered to the back-side of substrate 125 via a backside gas system to improve the gas-gap thermal conductance between substrate 125 and substrate holder 120. For instance, the heat transfer gas supplied to the back-side of substrate 125 can comprise an inert gas such as helium, argon, xenon, krypton, a process gas, or other gas such as oxygen, nitrogen, or hydrogen. Such a system can be utilized when temperature control of the substrate is required at elevated or reduced temperatures. For example, the backside gas system can comprise a multi-zone gas distribution system such as a two-zone (center-edge) system, wherein the back-side gas gap pressure can be independently varied between the center and the edge of substrate 125. In other embodiments, heating/cooling elements, such as resistive heating elements, or thermo-electric heaters/coolers can be included in the substrate holder 120, as well as the chamber wall of the processing chamber 110.

Additionally, substrate holder 120 can include an electrode through which AC power, such as RF power, or DC power is coupled to substrate 125. For example, substrate holder 120 can be electrically biased at a RF voltage via the transmission of RF power from a RF generator through an impedance match network to substrate holder 120. A typical frequency for the RF bias can range from 0.1 MHz to 100 MHz. RF systems for plasma processing are well known to those skilled in the art. Alternately, RF power is applied to the substrate holder electrode at multiple frequencies. Furthermore, an impedance match network can serve to improve the transfer of RF power to plasma in the process chamber by reducing the reflected power. Match network topologies (e.g. L-type, π-type, T-type, etc.) and automatic control methods are well known to those skilled in the art.

Alternately, a pulsed RF bias can be applied to substrate holder 120. For example, the RF bias can originate from an oscillator and applied to substrate holder 120 through an impedance match network. An amplifier can increase the amplitude of the RF bias signal output from the oscillator subject to amplitude modulation via a signal output from a waveform signal generator. The amplifier can send the amplified RF bias signal to the impedance match network.

The amplifier can be a linear RF amplifier suitable for receiving the oscillator input from the oscillator and the amplitude modulation signal from the waveform signal generator. One example of the signal output from the waveform signal generator is a pulse waveform. An exemplary system including the amplifier and an internal pulse generator is a commercially available linear RF amplifier (Model line LPPA) from Dressler (2501 North Rose Drive, Placentia, Calif. 92670). The above amplifier is capable of operating in continuous mode as well as pulse mode with RF powers ranging from 400 to 8000 W at frequencies ranging from 10 to 500 MHz. Moreover, the above amplifier can achieve pulse widths as short as 20 milliseconds.

The impedance match network serves to maximize the transfer of RF power to substrate holder 120 by minimizing the reflected power. Match network topologies (e.g. L-type, $\pi$-type, T-type, etc.) for achieving this end are known. Match network settings for tuning capacitors C1 and C2 in, for example, an L-type configuration, are controlled via a controller during both start and run-time conditions. Preferably, an automatic match network control methodology is employed to maintain optimal match throughout the entirety of the process. However, the response for typical match networks is approximately 150 milliseconds. Therefore, it is not expected that a conventional (mechanically tuned) match network can respond optimally to pulse widths less than approximately 150 milliseconds. In such a case, a conventional match network is designed for run and start set-points based upon the continuous flow process gas conditions. If on the other hand, pulse widths in excess of several hundred milliseconds are employed, conventional match networks are sufficiently fast to respond and provide an optimal impedance match even during pulsing periods.

Additionally, the processing system 100 of FIG. 1 further includes pumping system 145 through which process gases and effluent gases can be removed (or evacuated) from processing chamber 110. Pumping system 150 preferably includes a turbo-molecular vacuum pump (TMP) capable of a pumping speed up to 5000 liters per second (and greater) and a gate valve for throttling the chamber pressure.

Furthermore, control system 150 can include a microprocessor, memory, and a digital I/O port capable of generating control voltages sufficient to communicate and activate inputs to processing system 100 as well as monitor outputs from processing system 100. Moreover, control system 150 can be coupled to and can exchange information with processing chamber 110, substrate holder 120, plasma source 130, gas injection system 140, and pumping system 145. For example, a program stored in the memory can be utilized to activate the inputs to the aforementioned components of processing system 100 according to a process recipe in order to perform a deposition process. One example of control system 150 includes a DELL PRECISION WORKSTATION 610™, available from Dell Corporation, Austin, Tex.

As illustrated in FIG. 1, the control system 150 can be locally located relative to the processing system 100, or it can be remotely located relative to the processing system 100. For example, control system 150 can exchange data with processing system 100 using at least one of a direct connection, an intranet, and the internet. Control system 150 can be coupled to an intranet at, for example, a customer site (i.e., a device maker, etc.), or it can be coupled to an intranet at, for example, a vendor site (i.e., an equipment manufacturer). Additionally, for example, control system 150 can be coupled to the internet. Furthermore, another computer (i.e., controller, server, etc.) can, for example, access control system 150 to exchange data via at least one of a direct connection, an intranet, and the internet.

Figure 7:
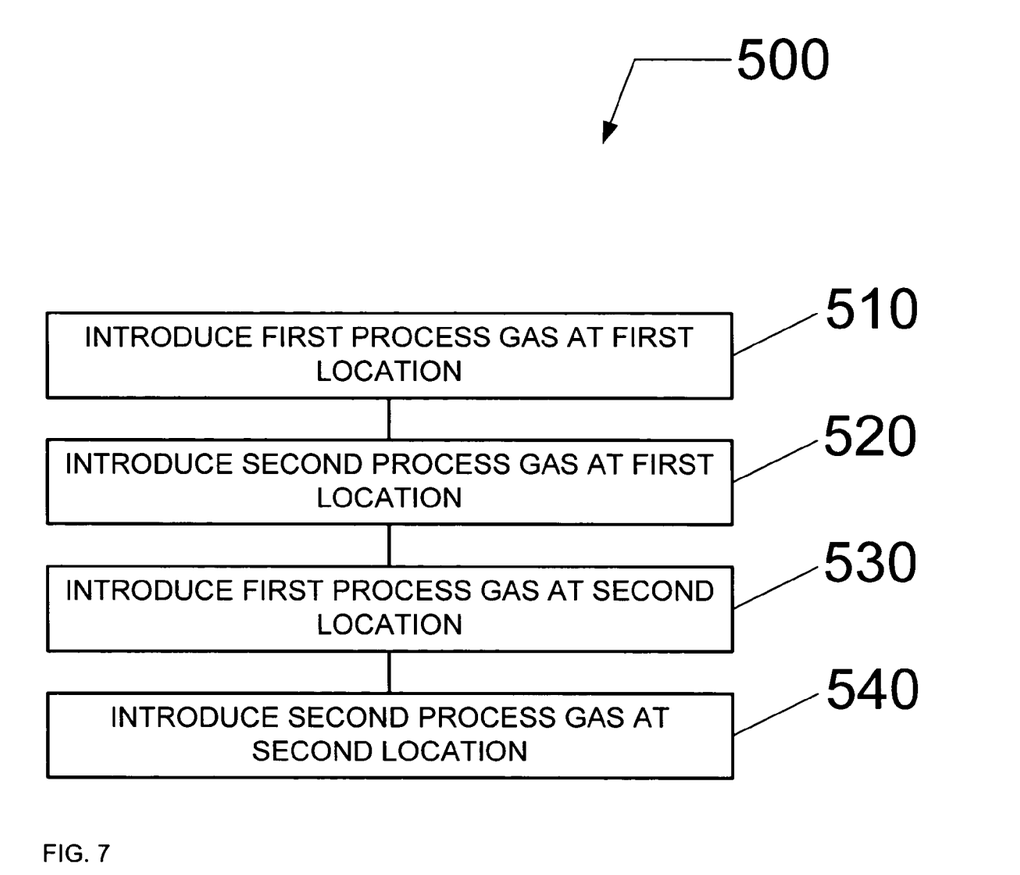
FIG. 7 outlines a procedure for operating the system of FIG. 1 according to an embodiment of the invention.

Referring now to FIG. 7, a method of depositing a thin film on a substrate in a processing chamber is described. The method is illustrated as a flow chart 500 beginning in 510 with introducing a first process gas to the processing chamber at a first location. In 520, a second process gas is introduced to the processing chamber at the first location. In 530, the first process gas is introduced to the processing chamber from a second location, and in 540 the second process gas is introduced to the processing chamber from the second location.

At least one of the first process gas and the second process gas is alternatingly and sequentially introduced between the first location and the second location. For example, the first process gas can be introduced at the first location for a first period of time, and then be introduced at the second location for a second period of time. Alternatively, both the first process gas and the second process gas can be introduced at the first location for a first period of time, and then be introduced at the second location for a second period of time. Alternatively, the first process gas is introduced at the first location for a first period of time and the second process gas is introduced at the first location for a second period of time, then the first process gas is introduced at the second location for a third period of time and the second process gas is introduced at the second location for a fourth period of time.

The flow rate of the first process gas can range from 10 to 10000 sccm. The flow rate of the second process gas can range from 10 to 10000 sccm. A chamber pressure can range from 1 to 1000 mTorr. The injection total pressure can range from 1 to 1000 Torr. The time duration for process gas introduction can range from 1 to 1000 milliseconds, while the time duration between gas introduction can range from 1 millisecond to 10 seconds. The substrate temperature can range from 10 degrees C. to 400 degrees C. The spacing d (see FIG. 1) between the upper surface of the substrate and the lower surface of the plasma source can range from 20 to 200 mm, and desirably the spacing d can range from 40 to 120 mm.

The present inventors have discovered that the deposition system of FIGS. 1, 5 and 6, when operated as described above provides increased sequencing and gaseous exchange rates that lead to greater a deposition rate that is feasible for a wider range of production processes.

In one embodiment, an atomic layer deposition (ALD) process according to the method of operation presented in FIG. 7 is now described. The first process gas can include a first precursor with or without a carrier gas. Additionally, the second process gas can include a second precursor with or without a carrier gas. For example, the carrier gas can include an inert gas, such as a Noble gas (i.e., He, Ne, Ar, Kr, Xe, Rn). The first precursor and the second precursor can be selected depending upon the material to be deposited.

In one example, when depositing tungsten, the first precursor can include $WF_6$, or $W(CO)_6$, and the second precursor can include $H_2$.

In another example, when depositing tungsten nitride, the first precursor can include $WF_6$, and the second precursor can include $NH_3$, or $N_2$ and $H_2$.

In another example, when depositing tantalum, the first precursor can include $TaCl_5$, and the second precursor can include $H_2$.

In another example, when depositing tantalum pentoxide, the first precursor can include $TaCl_5$, and the second precursor can include $H_2O$, or $H_2$ and $O_2$.

In another example, when depositing tantalum nitride (i.e., $TaN_x$), the first precursor can include a tantalum containing precursor, such as TaCl$_5$, PDEAT (pentakis(diethylamido) tantalum), PEMAT (pentakis(ethylmethylamido)tantaluum), TaBr$_5$, or TBTDET (t-butylimino tris(diethylamino)tantalum). The second precursor can include a mixture of H$_2$ and N$_2$.

In another example, when depositing molybdenum, the first precursor can include molybdenum hexafluoride, and the second precursor can include H$_2$.

In another example, when depositing copper, the first precursor can include organometallic compounds, such as Cu(T-MVS)(hfac), or (Trimethylvinylsilyl)hexafluoroacetylacetonato Copper I, also known by the trade name CupraSelect®, available from Schumacher, a unit of Air Products and Chemicals, Inc., 1969 Palomar Oaks Way, Carlsbad, Calif. 92009), or inorganic compounds, such as CuCl. The second precursor can include at least one of H$_2$, O$_2$, N$_2$, NH$_3$, or H$_2$O. As used herein, the term "at least one of A, B, C, . . . or X" refers to any one of the listed elements or any combination of more than one of the listed elements.

In another example, when depositing ZrO$_2$, the first precursor can include Zr(NO$_3$)$_4$, or ZrCl$_4$, and the second precursor can include H$_2$O.

In another example, when depositing HfO$_2$, the first precursor can include Hf(NO$_3$)$_4$, or HfCl$_4$, and the second precursor can include H$_2$O.

In another example, when depositing Hf, the first precursor can include HfCl$_4$, and the second precursor can include H$_2$.

In another example, when depositing niobium, the first precursor can include niobium pentachloride, and the second precursor can include H$_2$.

In another example, when depositing zinc, the first precursor can include zinc dichloride, and the second precursor can include H$_2$.

In another example, when depositing SiO$_2$, the first precursor can include Si(NO$_3$)$_4$, and the second precursor can include H$_2$O.

In another example, when depositing SiO$_2$, the first precursor can include dichlorosilane, and the second precursor can include H$_2$.

In another example, when depositing SiO$_2$, the first precursor can include SiCl$_4$, and the second precursor can include H$_2$O, or H$_2$ and O$_2$.

In another example, when depositing silicon nitride, the first precursor can include SiCl$_4$, or dichlorosilane, and the second precursor can include NH$_3$, or N$_2$ and H$_2$.

In another example, when depositing TiN, the first precursor can include Ti(NO$_3$), and the second precursor can include NH$_3$.

In another example, when depositing Ti, the first precursor can include titanium tetrachloride, or titanium tetraiodide, and the second precursor can include H$_2$.

In another example, when depositing titanium oxide, the first precursor can include titanium tetrachloride, or titanium tetraiodide, and the second precursor can include H$_2$O, or H$_2$ and O$_2$.

In another example, when depositing TiN, the first precursor can include titanium tetrachloride, and the second precursor can include NH$_3$.

In another example, when depositing Ti, the first precursor can include tetrakis(diethylamino)titanium or tetrakis(dimethylamino)titanium, and the second precursor can include H$_2$.

In another example, when depositing TiN, the first precursor can include tetrakis(diethylamino)titanium or tetrakis(dimethylamino)titanium, and the second precursor can include NH$_3$.

In another example, when depositing aluminum, the first precursor can include aluminum trichloride, or trimethylaluminum, and the second precursor can include H$_2$.

In another example, when depositing aluminum nitride, the first precursor can include aluminum trichloride, or trimethylaluminum, and the second precursor can include NH$_3$, or N$_2$ and H$_2$.

In another example, when depositing aluminum oxide, the first precursor can include aluminum trichloride, or trimethylaluminum, and the second precursor can include H$_2$O, or O$_2$ and H$_2$.

In another example, when depositing GaN, the first precursor can include gallium nitrate, or trimethylgallium, and the second precursor can include NH$_3$.

In another example, when depositing Cr, the first precursor can include Cr oxo-nitrate, and the second precursor can include H$_2$.

The second precursor can, for example, be at least one of H$_2$, O$_2$, N$_2$, NH$_3$, H$_2$O, or H$_2$O$_2$.

In another example, the first and second process gases are injected under high pressure (total pressure of 100 Torr to 1000 Torr). Additionally, the spacing d is approximately 105 mm, and the pumping speed delivered to the process space above the substrate is 1000 liters/second. Under these conditions, the gaseous exchange rate can be approximately 10 milliseconds (msec). In another example, the pumping speed is 2000 l/sec, and the gaseous exchange rate is 5 msec.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. An atomic layer deposition (ALD) system for depositing a film on a substrate comprising: a processing chamber; a substrate holder coupled to said process chamber and configured to support said substrate; a pumping system coupled to said process chamber and configured to evacuate said process chamber; a plasma source coupled to said process chamber and configured to generate plasma in said process chamber; and a gas injection system including first and second nozzles, protruding within said process chamber, said first and second nozzles each introduce a first process gas and a second process gas to said processing chamber, said first and second process gases are delivered unmixed; said first nozzle introduces said unmixed first and second process gases at a first location, and said second nozzle introduces said unmixed first and second process gases at a second location different than the first location, said first and second nozzles each including, a first gas injection valve, a first gas line, a first gas injection orifice configured to introduce said first process gas unmixed into the process chamber, a second gas injection valve, a second gas line, and second gas injection orifice configured to introduce said second process gas unmixed into the process chamber, the first and second gas injection valves of the first nozzle are different than the first and second gas injection valves of the second nozzle; a controller coupled to the ALD system configured to control independently said first and second nozzles such that at least one of said first process gas and said second process gas is alternatingly and sequentially introduced between said first location and said second location, and said first process gas and second process gas is alternatingly and sequentially introduced at each of said nozzles.

2. The ALD system of claim 1, wherein said controller is configured to perform at least one of adjusting, monitoring, or controlling said introduction of said first process gas and said second process gas to said process chamber.

3. The ALD system of claim 1, wherein said controller controls said gas injection system such that said first process gas is introduced at said first location for a first period of time, and then introduced at said second location for a second period of time.

4. The ALD system of claim 1, wherein said controller controls said gas injection system such that said first process gas and said second process gas are introduced at said first location for a first period of time, and then at said second location for a second period of time.

5. The ALD system of claim 1, wherein said controller controls said gas injection system such that said first process gas is introduced at said first location for a first period of time and said second process gas is introduced at said first location for a second period of time, then said first process gas is introduced at said second location for a third period of time and said second process gas is introduced at said second location for a fourth period of time.

6. The ALD system of claim 1, wherein said substrate holder is configured to heat said substrate to a target temperature.

7. The ALD system of claim 6, wherein the substrate holder is configured to heat the substrate to a temperature ranging from approximately 40 C to approximately 450 C.

8. The ALD system of claim 1 wherein said substrate holder is configured to control the temperature of said substrate at an elevated temperature.

9. The ALD system of claim 1, wherein said substrate holder is configured to couple an electrical bias to said substrate.

10. The ALD system of claim 1, wherein said substrate holder is configured to couple a pulsed electrical bias to said substrate.

11. The ALD system of claim 1, wherein said first and second gas injection valves include pulsed gas injection valves configured to inject said first process gas and said second process gas at said first location and said second location, respectively.

12. The ALD system of claim 11, wherein said pulsed gas injection valves comprise solenoidal valves.

13. The ALD system of claim 1, wherein said gas injection system is configured to supply said first process gas selected from the group consisting of $WF_6$, $W(CO)_6$, $TaCl_5$, PDEAT (pentakis(diethylamido) tantalum), PEMAT (pentakis(ethylmethylamido) tantaluum), $TaBr_5$, TBTDET (t-butylimino tris (diethylamino) tantalum), molybdenum hexafluoride, Cu(TMVS)(hfac), (Trimethylvinylsilyl) hexafluoroacetylacetonato Copper I, CuCl, $Zr(NO_3)_4$, $ZrCl_4$, $Hf(NO_3)_4$, $HfCl_4$, niobium pentachloride, zinc dichloride, $Si(NO_3)_4$, $SiCl_4$, dichlorosilane, $Ti(NO_3)$, $TiCl_4$, $TiI_4$, tetrakis(diethylamino)titanium, tetrakis(dimethylamino)titanium, aluminum trichloride, trimethylaluminum, gallium nitrate, trimethylgallium, and Cr oxo-nitrate.

14. The ALD system of claim 1, wherein said gas injection system is configured to supply said second process gas as at least one of $H_2$, $N_2$, $O_2$, $H_2O$, $NH_3$, or $H_2O_2$.

15. The ALD system of claim 1, wherein said first process gas further includes a carrier gas.

16. The ALD system of claim 15, wherein said carrier gas includes a Noble gas.

17. The ALD system of claim 1, wherein said second process gas further includes a carrier gas.

18. The system of claim 17, wherein said carrier gas includes a Noble gas.

19. An atomic layer deposition system having a processing chamber and substrate holder, the system comprising: first means for introducing a first process gas to said processing chamber at a first location and a second location, said first and second locations being different, said first means for introducing the first process gas protruding within said process chamber, said first means for introducing process gas at the first location including, first means for introducing said first process gas unmixed into the process chamber, and first means for introducing said second process gas unmixed into the process chamber; second means for introducing a second process gas to said processing chamber at said first location and said second location, said second means for introducing the second process gas protruding within said process chamber, said second means for introducing process gas at the second location including, second means for introducing said first process gas unmixed into the process chamber, and second means for introducing said second process gas unmixed into the process chamber; and means for producing a plasma in said processing chamber, means for independently controlling each of said first means for introducing first and second process gases at the first location and second means for introducing first and second process gases at the second location such that at least one of said first process gas and said second process gas is alternatingly and sequentially introduced between said first location and said second location, and at least one of said first process gas and said second process gas is alternatingly and sequentially introduced at each location; wherein (a) said first and second means for introducing said first process gas unmixed at said first and second locations are separate means and (b) said first and second means for introducing said second process gas unmixed at said first and second locations are separate means.

20. The ALD system of claim 1, wherein said first and second gas injection valves are configured to inject said first and second process gases simultaneously and unmixed.

21. The ALD system of claim 19, wherein said first and second means for introducing said first process gas and said first and second means for introducing said second process gas inject said first and second process gases simultaneously and unmixed.

* * * * *